United States Patent

Kang

(10) Patent No.: US 8,610,472 B2
(45) Date of Patent: Dec. 17, 2013

(54) POWER-UP SIGNAL GENERATING CIRCUIT OF SEMICONDUCTOR INTEGRATED CIRCUIT

(75) Inventor: Dong-Geum Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 92 days.

(21) Appl. No.: 13/291,641

(22) Filed: Nov. 8, 2011

(65) Prior Publication Data

US 2013/0021065 A1  Jan. 24, 2013

(30) Foreign Application Priority Data

Jul. 22, 2011 (KR) .................. 10-2011-0073210

(51) Int. Cl.
*H03L 7/00* (2006.01)
(52) U.S. Cl.
USPC ............................. 327/143; 327/142; 327/198
(58) Field of Classification Search
USPC .......................................... 327/142, 143, 198
See application file for complete search history.

(56) References Cited

U.S. PATENT DOCUMENTS

| 7,212,046 | B2 * | 5/2007 | Hur | 327/143 |
| 7,777,560 | B2 * | 8/2010 | Kang | 327/541 |
| 8,373,457 | B2 * | 2/2013 | Kang | 327/142 |
| 2005/0104566 | A1 * | 5/2005 | Kim | 323/226 |
| 2009/0243704 | A1 * | 10/2009 | Kang | 327/513 |
| 2010/0097109 | A1 * | 4/2010 | Suzuki | 327/143 |

* cited by examiner

Primary Examiner — Lincoln Donovan
Assistant Examiner — Brandon S Cole
(74) Attorney, Agent, or Firm — IP & T Group LLP

(57) ABSTRACT

A power-up signal generation circuit includes a discharge driving unit configured to discharge a voltage of a power-up detection node in response to a voltage of an external power supply voltage, a charge driving unit configured to charge the voltage of the power-up detection node in response to a voltage of an internal power supply voltage, a power reset discharging unit configured to discharge a voltage of the power-up detection node while the semiconductor integrated circuit is reset, and an output unit configured to output a power-up signal in response to a voltage change of the power-up detection node.

20 Claims, 5 Drawing Sheets

POWER-UP SIGNAL GENERATING CIRCUIT OF SEMICONDUCTOR INTEGRATED CIRCUIT

CROSS-REFERENCE TO RELATED APPLICATIONS

The present application claims priority of Korean Patent Application No. 10-2011-0073210, filed on Jul. 22, 2011, which is incorporated herein by reference in its entirety.

BACKGROUND

1. Field

Exemplary embodiments of the present invention relate to semiconductor design technology, and more particularly, to a power-up signal generation circuit of a semiconductor integrated circuit.

2. Description of the Related Art

A semiconductor integrated circuit (IC) includes an internal power supply voltage generation unit configured to supply internal power supply voltages in response to an external power supply voltage, thereby stably operating various internal logic circuitry and other elements. If the internal power supply voltages does not have a proper voltage level during the application of the external power supply voltage, a malfunction such as latch-up, occur. In this case, it is difficult to secure the reliability of the semiconductor IC.

When the internal logic circuitry is not initialized to have a specific value before power supply voltages are supplied to operate the elements thereof, the IC may malfunction to input and output accurate data. Therefore, the IC may further include a circuit to initialize the internal logic circuitry before the operation of the other elements.

To prevent the latch up from occurring due to the instability of the internal power supply voltage and to initialize the internal logic circuitry, the semiconductor IC includes a power-up signal generation circuit configured to generate a power-up signal.

Semiconductor memory devices are being designed in such a manner as to perform a variety of operations in order to meet various market demands. For example, when a power supply voltage is supplied again, a semiconductor memory device is to stably maintain operation properties in a car navigation system (CNS).

FIG. 1 is a block diagram of a power-up signal generation circuit of a conventional semiconductor IC.

Referring to FIG. 1, the power-up signal generation circuit includes an external power supply voltage detection unit 110, an internal power supply voltage detection unit 120, and a combination unit 130. The external power supply voltage detection unit 110 is configured to detect a voltage level of an external power supply voltage VEXT and generate a first power-up signal PUPB. The internal power supply voltage detection unit 120 is configured to detect a voltage level of an internal power supply voltage VINT and generate a second power-up signal PUPBP. The combination unit 130 is configured to combine the first power-up signal PUPB and the second power-up signal PUPBP and generate a final power-up signal PWRUP.

FIG. 2 is a waveform diagram of signals for the power-up signal generation circuit of FIG. 1.

Referring to FIG. 2, power is externally supplied to increase the external power supply voltage VEXT. When the level of the external power supply voltage VEXT reaches a desired level, the external power supply voltage detection unit 110 detects the level such that the first power-up signal PUPB changes from a logic low level to a logic high level.

When the first power-up signal PUPB has changed to the logic high level, an internal power supply voltage generation unit is activated to operate in response to the first power-up signal PUPB. Accordingly, the internal power supply voltage VINT increases.

When the internal power supply voltage increases to a stable level, the internal power supply voltage detection unit 120 detects the level such that the second power-up signal PUPBP changes from the logic low level to the logic high level.

The combination unit 130 changes the final power-up signal PWRUP from the logic low level to the logic high level in response to both the first and second power-up signals PUPB and PUPBP being changed from the logic low level to the logic high level. Therefore, when the final power-up signal PWRUP has changed from the logic low level to the logic high level, the internal logic circuitry of the semiconductor IC is activated.

FIG. 3 illustrates a circuit configuration of the internal power supply voltage detection unit 120 of the conventional power-up signal generation circuit.

Referring to FIG. 3, the internal power supply detection unit 120 includes a first block configured to lower a voltage of a power-up detection node NC, a second block configured to raise a voltage of the power-up detection node NC, and a third block configured to output the second power-up signal PUPBP in response to a voltage change of the power-up detection node NC.

The first block includes a first PMOS transistor MP1, a first NMOS transistor MN1, and a second NMOS transistor MN2. The first PMOS transistor MP1 has a source coupled to a terminal of the external power supply voltage VEXT and a drain coupled to a first node NA, and receives a ground voltage VSS through a gate thereof. The first NMOS transistor MN1 has a source coupled to a terminal of the ground voltage VSS and drain and gate coupled to the first node NA. The second NMOS transistor MN2 has a source coupled to the terminal of the ground voltage VSS, a drain coupled to the power-up detection node NC, and a gate coupled to the first node NA.

The second block includes a second PMOS transistor MP2 and a third PMOS transistor MP3. The second PMOS transistor MP2 has a source coupled to a terminal of the internal power supply voltage VINT and drain and gate coupled to a second node NB. The third PMOS transistor MP3 has a source coupled to the second node NB and a drain coupled to the power-up detection node NC, and receives a ground voltage VSS through a gate thereof.

The third block includes an inverter INV1, a fourth PMOS transistor MP4, and an inverter INV2. The inverter INV1 has an input node coupled to the power-up detection node NC. The fourth PMOS transistor MP4 has a source coupled to the terminal of the internal power supply voltage VINT, a drain coupled to the power-up detection node NC, and a gate coupled to an output node ND of the inverter INV1. The inverter INV2 has an input node coupled to the output node ND and outputs the second power-up signal PUPBP.

When the external power supply voltage VEXT is supplied in a power-up sequence, the voltage of the first node NA increases to a threshold voltage VTH of the first NMOS transistor MN1. Accordingly, the second NMOS transistor MN2 is turned on to lower the voltage level of the power-up detection node NC.

When the internal power supply voltage generation unit operates to increase the voltage level of the internal power supply voltage VINT, the second PMOS transistor MP2 is turned on to increase the voltage level of the power-up detection node NC. At this time, the power-up detection node NC is continuously discharged by the second NMOS transistor MN2. However, since the voltage level raising ability of the second PMOS transistor MP2 and the third PMOS transistor MP3 is greater than the voltage level lowering ability of the second NMOS transistor MN2, the voltage level of the power-up detection node NC increases.

As such, when the voltage level of the power-up detection node NC increases to exceed a logic threshold value of the inverter INV1, the second power-up signal PUPBP changes to the logic high level. Since the voltage of the output node ND changes to the logic low level, the fourth PMOS transistor MP4 is turned on to latch the voltage of the power-up detection node NC to the logic high level.

When a system power is reset, the external supply voltage VEXT is not supplied, and the internal power supply voltage VINT has the level of a ground voltage VSS. In this case, since the voltage of the power-up detection node NC changes from the logic high level to the logic low level, the second power-up signal PUPBP changes from the logic high level to the logic low level and the final power-up signal PWRUP changes from the logic high level to the logic low level.

When the system power is resupplied, since the first power-up signal PUPB, the second power-up signal PUPBP, and the final power-up signal PWRUP change from the logic low level to the logic high level, the internal logic circuitry of the semiconductor IC is initialized to a specific value.

However, when the system power is supplied again, residual supply voltage may exist in the system. FIG. 4 is an operation waveform diagram of the external power supply voltage having the residual supply voltage when the system power is resupplied.

When the system power is reset and the external power supply voltage VEXT is unstably discharged, the power-up detection node NC of the internal power supply voltage detection unit 120 is not completely discharged from the logic high level to the logic low level. If the voltage level of the power-up detection node NC is maintained higher than the threshold voltage level of the inverter INV1, the second power-up signal PUPBP continuously maintains the logic high level. Accordingly, since the internal logic circuitry of the semiconductor IC is not initialized even though the system power is resupplied, a malfunction may occur.

Meanwhile, the MOS transistor has a temperature characteristic such that the threshold voltage decreases with a temperature increase ($-2$ mV/° C.). That is, at a high temperature, the threshold voltage decreases in comparison with the threshold voltage at a normal temperature. On the other hand, at a low temperature, the threshold voltage increases in comparison with at a normal temperature. Therefore, the threshold voltage VTH of the NMOS transistor NM2 increases in a low-temperature environment. This means that discharging ability of the NMOS transistor NM2 for the power-up detection node NC decreases and the power-up detection node NC may not be completely discharged when the system power is reset.

SUMMARY

Exemplary embodiments of the present invention are directed to a power-up signal generation circuit of a semiconductor integrated circuit which prevents a malfunction from being caused by a residual supply voltage when the system power is reset.

Exemplary embodiments of the present invention are directed to a power-up signal generation circuit of a semiconductor integrated circuit which prevents a malfunction from being caused by a variation in the threshold voltage of MOS transistors in a low-temperature environment.

In accordance with an embodiment of the present invention, a power-up signal generation circuit of a semiconductor integrated circuit includes: a discharge driving unit configured to discharge a voltage of a power-up detection node in response to an external power supply voltage; a charge driving unit configured to charge the voltage of the power-up detection node in response to an internal power supply voltage; a power reset discharging unit configured to discharge the voltage of the power-up detection node while the semiconductor integrated circuit is reset; and an output unit configured to output a power-up signal in response to a voltage change of the power-up detection node.

In accordance with another embodiment of the present invention, a power-up signal generation circuit of a semiconductor integrated circuit includes: a discharge driving unit configured to discharge a voltage of a power-up detection node in response to an external power supply voltage; a charge driving unit configured to charge the voltage of the power-up detection node in response to an internal power supply voltage; an output unit configured to output a power-up signal in response to a voltage change of the power-up detection node; and a temperature compensation unit configured to raise a discharge driving voltage of the discharge driving unit at a low-temperature in response to a temperature information while the semiconductor integrated circuit is reset, wherein the low-temperature is lower than a preset temperature.

In accordance with further embodiment of the present invention, a power-up signal generation circuit of a semiconductor integrated circuit includes: a power supply voltage detection unit configured to detect an external power supply voltage and an internal power supply voltage and generate a power-up signal, wherein the power supply voltage detection unit is configured to generate the power-up signal with a driving voltage charged and discharged in response to the internal and external power supply voltages, respectively; and a temperature compensation unit configured to control the driving voltage in response to a temperature information.

DETAILED DESCRIPTION

Figure 1:
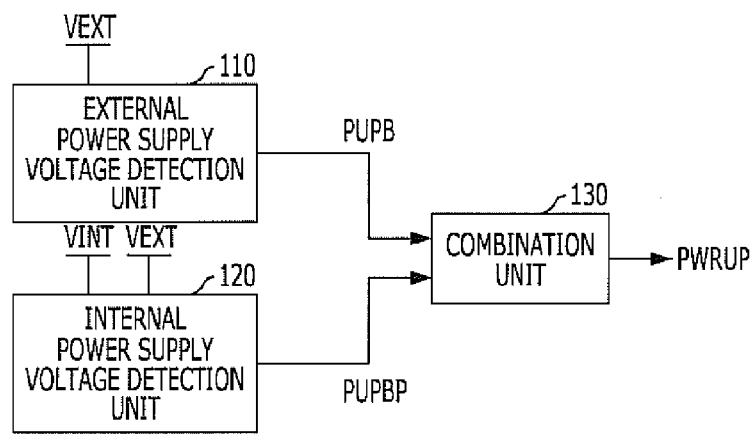
FIG. 1 is a block diagram of a power-up signal generation circuit of a conventional semiconductor integrated circuit (IC).
Figure 2:
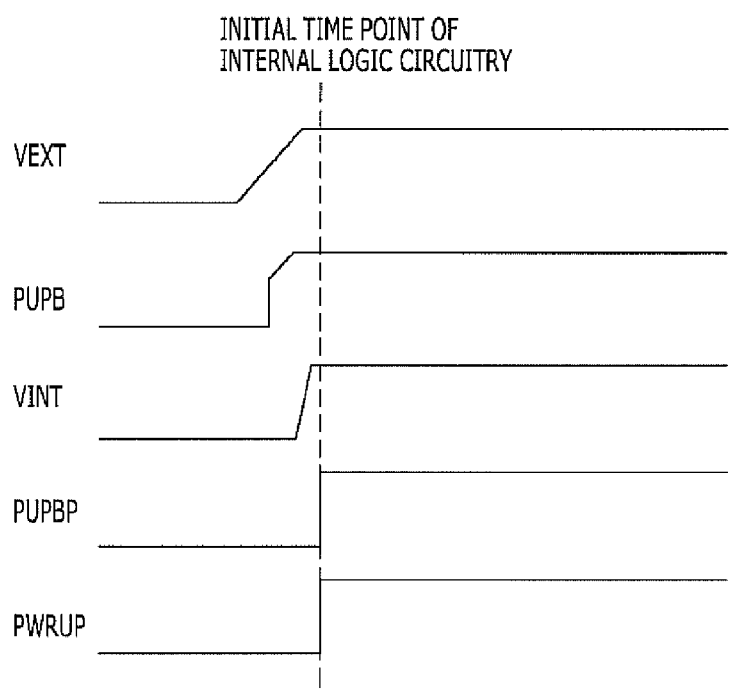
FIG. 2 is an operation waveform diagram of signals for the power-up signal generation circuit of FIG. 1.
Figure 3:
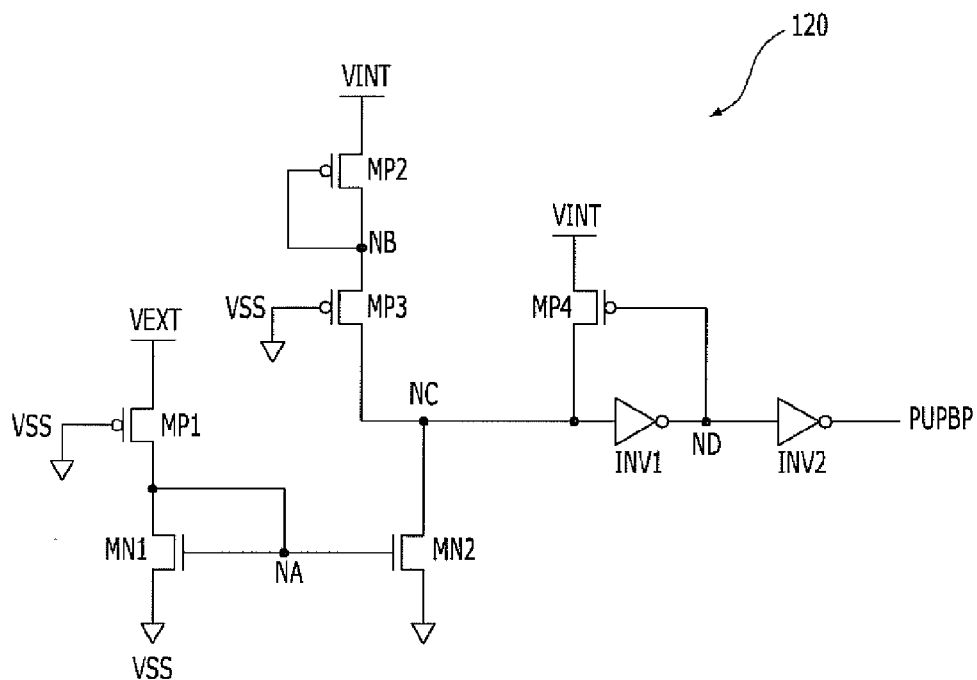
FIG. 3 illustrates a circuit configuration of an internal power supply voltage detection unit of the conventional power-up signal generation circuit.
Figure 4:
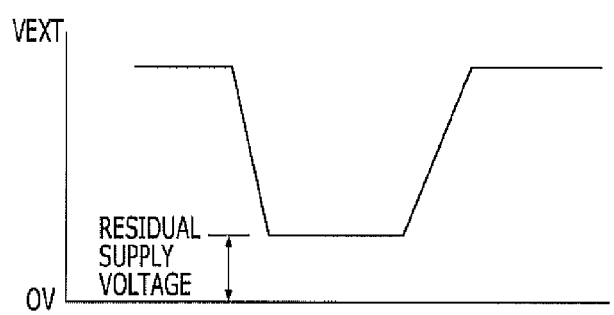
FIG. 4 is an operation waveform diagram of an external power supply voltage having the residual supply voltage when the system power is resupplied.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
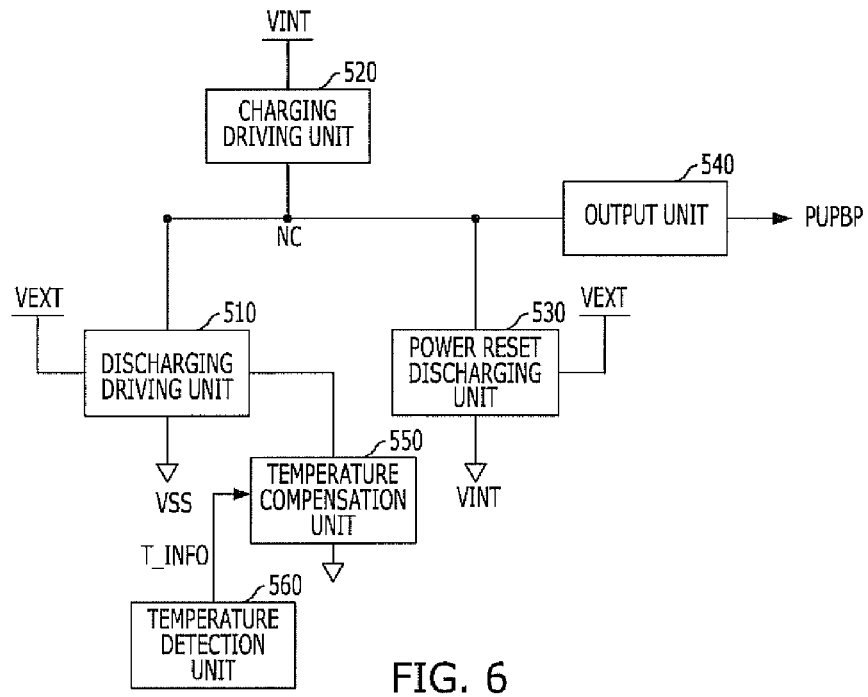
FIG. 5 is a block diagram of a power-up signal generation circuit of a semiconductor IC in accordance with an embodiment of the present invention.

FIG. 5 is a block diagram of a power-up signal generation circuit of a semiconductor integrated circuit (IC) in accordance with an embodiment of the present invention.

Referring to FIG. 5, the power-up signal generation circuit of a semiconductor IC in accordance with this embodiment of the present invention includes a discharge driving unit 510, a charge driving unit 520, a power reset discharging unit 530, and an output unit 540. The discharge driving unit 510 is configured to discharge a voltage of a power-up detection node NC in response to a level of an external power supply voltage VEXT. The charge driving unit 520 is configured to charge a voltage of the power-up detection node NC in response to a level of an internal power supply voltage VINT. The power reset discharging unit 530 is configured to discharge a voltage of the power-up detection node NC while a system power is reset. The output unit 540 is configured to output a power-up signal PUPBP in response to a voltage change of the power-up detection node NC.

The power-up signal generation circuit further includes a temperature compensation unit 550 configured to control a driving current of the discharge driving unit 510 in response to temperature information T_INFO. The temperature compensation unit 550 operates independently of the power reset discharging unit 530 but the temperature compensation unit 550 may complement the power reset discharging unit 530 under the low-temperature environment. The power-up signal generation circuit further includes a temperature detection unit 560. The temperature detection unit 560 generates the temperature information T_INFO.

When the external power supply voltage VEXT is supplied in a power-up sequence, the discharge driving unit 510 detects the external power supply voltage VEXT to discharge the voltage of the power-up detection node NC.

When an internal power supply voltage generation unit operates to raise the level of the internal power supply voltage VINT, the charge driving unit 520 charges a voltage of the power-up detection node NC to increase the voltage of the power-up detection node NC. When the voltage level of the power-up detection node NC exceeds a preset level, the output unit 540 outputs the activated power-up signal PUPBP.

When the system power is reset, the power-up detection node NC is discharged. At this time, if the residual supply voltage of the external power supply voltage VEXT may exist in the system, the power-up detection node NC is not completely discharged. However, even though the residual supply voltage of the external power supply voltage VEXT may exist in the system, the power reset discharging unit 530 is activated to completely discharge the power-up detection node NC by detecting decrement of the external power supply voltage VEXT. Therefore, even though the system power is resupplied when the residual supply voltage remains in the system, the embodiment of the present invention prevents the occurrence of malfunction such that the internal logic circuitry of the semiconductor IC starts to operate without being initialized.

The temperature compensation unit 550 is activated by the temperature information T_INFO in a room-temperature environment so the driving current of the discharge driving unit 510 has a certain value. On the other hand, the temperature compensation unit 550 is inactivated by the temperature information T_INFO in the low-temperature environment so the driving current of the discharge driving unit 510 increases. Therefore, the power-up detection node NC may be sufficiently discharged by increasing the discharge driving ability of the discharge driving unit 510 in the low-temperature environment, even when the residual supply voltage remains at the system reset.

Figure 6:
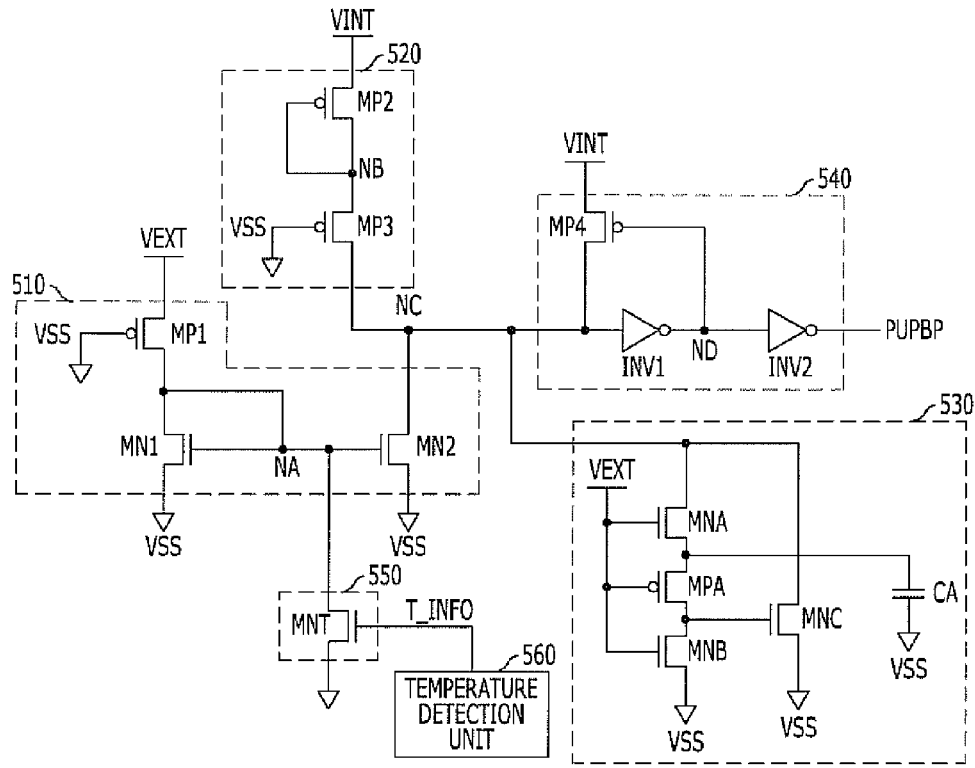
FIG. 6 is a schematic circuit diagram illustrating the power-up signal generation circuit of FIG. 5.

FIG. 6 is a diagram illustrating an example of the power-up signal generation circuit of FIG. 5.

Referring to FIG. 6, the discharge driving unit 510 includes a first PMOS transistor MP1, a first NMOS transistor MN1, and a second NMOS transistor MN2. The first PMOS transistor MP1 has a source coupled to a terminal of the external power supply voltage VEXT and a drain coupled to a first node NA, and receives a ground voltage VSS through a gate thereof. The first NMOS transistor MN1 has a source coupled to a terminal of the ground voltage VSS and drain and gate coupled to the first node NA. The second NMOS transistor MN2 has a source coupled to the terminal of the ground voltage VSS, a drain coupled to the power-up detection node NC, and a gate coupled to the first node NA.

The charge driving unit 520 includes a second PMOS transistor MP2 and a third PMOS transistor MP3. The second PMOS transistor MP2 has a source coupled to a terminal of the internal power supply voltage VINT and drain and gate coupled to a second node NB. The third PMOS transistor MP3 has a source coupled to the second node NB and a drain coupled to the power-up detection node NC, and receives the ground voltage VSS through a gate thereof.

The output unit 540 includes a first inverter INV1, a fourth PMOS transistor MP4, and a second inverter INV2. The first inverter INV1 has an input node coupled to the power-up detection node NC. The fourth PMOS transistor MP4 has a source coupled to the terminal of the internal power supply voltage VINT, a drain coupled to the power-up detection node NC, and a gate coupled to an output node ND of the third inverter INV1. The second inverter INV2 has an input node coupled to the output node ND, and outputs the second power-up signal PUPBP.

The power reset discharging unit 530 includes a third NMOS transistor MNA, a fifth PMOS transistor MPA, a fourth NMOS transistor MNB, a fifth NMOS transistor MNC and a capacitor CA. The third NMOS transistor MNA has a drain coupled to the power-up detection node NC and a gate coupled to the terminal of the external power supply voltage VEXT. The fifth PMOS transistor MPA has a source coupled to the source of the third NMOS transistor MNA and a gate coupled to the terminal of the external power supply voltage VEXT. The fourth NMOS transistor MNB has a source coupled to the terminal of the ground voltage VSS, a drain coupled to the drain of the fifth PMOS transistor MPA, and a gate coupled to the terminal of the external power supply voltage VEXT. The fifth NMOS transistor MNC has a source coupled to the terminal of the ground voltage VSS, a drain coupled to the power-up detection node NC, and a gate coupled to the drain of the fourth NMOS transistor MNB. The capacitor CA is coupled between the source of the fifth PMOS transistor MPA and the terminal of the ground voltage VSS.

The temperature compensation unit 550 includes a sixth NMOS transistor MNT. The sixth NMOS transistor MNT has a source coupled to the terminal of the ground voltage VSS, a drain coupled to the first node NA and a gate receiving the temperature information T_INFO.

An operation of the power reset discharging unit 530 is described as follows.

The third NMOS transistor MNA and fourth NMOS transistor MNB are turned-on and the fifth PMOS transistors MPA and the fifth NMOS transistor MNC are turned-off by the external power supply voltage VEXT before the system power is reset. At this time, since the power-up detection node NC is charged to a level of the internal power supply voltage VINT, the capacitor CA is charged to a level VINT-VTH (MNA).

The third NMOS transistors MNA and fourth NMOS transistor MNB are turned-off and the fifth PMOS transistor MPA is turned-on, when the external power supply voltage VEXT is lower than the threshold voltage VTH (MNA) in a power down mode by resetting of the system power. The fifth NMOS transistor MNC is turned-on by discharging the power-up detection node NC and the capacitor CA and discharges the power-up detection node NC. The power-up detection node NC is completely discharged by an auxiliary discharging operation of the fifth NMOS transistor MNC even though the residual supply voltage remains at the system reset.

After, when the external power supply voltage VEXT is resupplied, the power reset discharging unit 530 does not discharge the power-up detection node NC any more.

Figure 7:
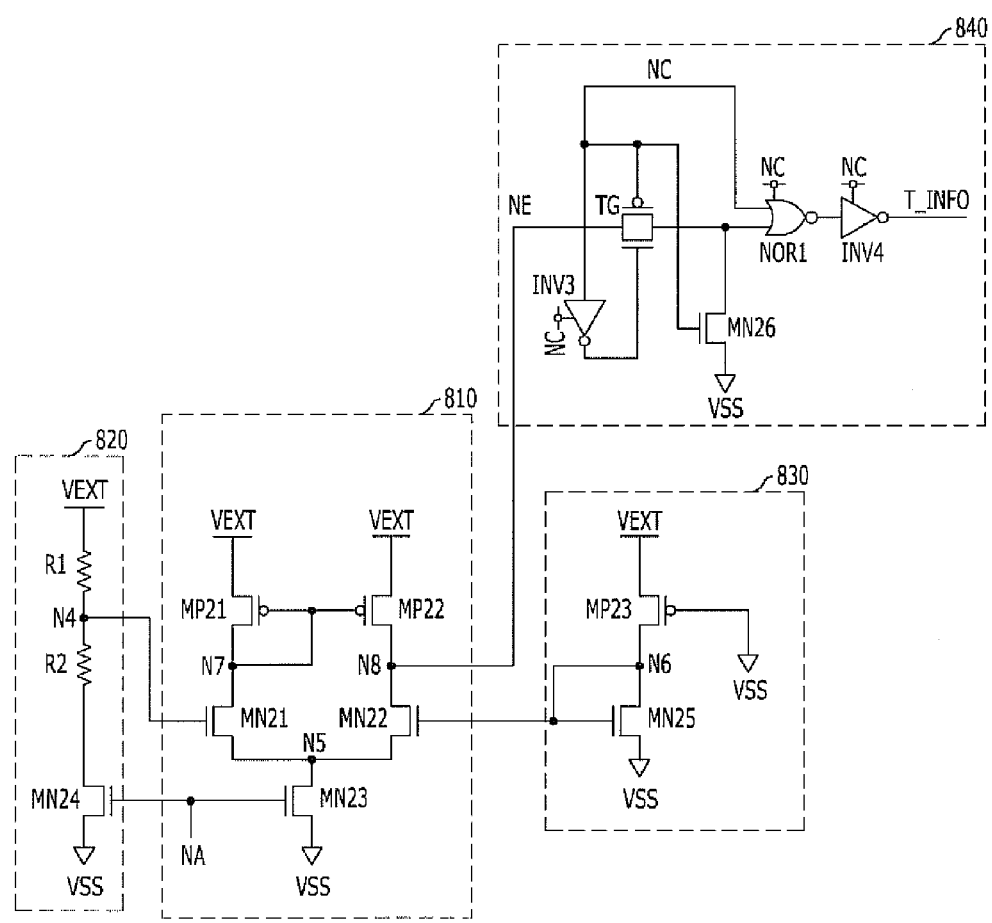
FIG. 7 is a schematic circuit diagram illustrating a temperature detection unit for generating temperature information T_INFO.

FIG. 7 is a diagram illustrating an example of the temperature detection unit 560 for generating the temperature information T_INFO.

Referring to FIG. 7, the temperature detection unit 560 includes a first input unit 820 configured to divide the external power supply voltage VEXT at a preset division ratio and output the divided voltage, a second input unit 830 configured to output a level of a threshold voltage VTH for a corresponding temperature, a comparison unit 810 configured to compare an output signal of the first input unit 820 with an output signal of the second input unit 830, and a switching unit 840 configured to output an output signal NE of the comparison unit 810 as the temperature information T_INFO in response to a voltage level of the power-up detection node NC.

The first input unit 820 includes a first resistor R1, a second resistor R2 and a seventh NMOS transistor MN24. The first resistor R1 is coupled between the terminal of the external power supply voltage VEXT and an output node N4. The second resistor R2 has one end coupled to the output node N4. The seventh NMOS transistor MN24 has a source coupled to the terminal of the ground voltage VSS, a drain coupled to the other end of the second resistor R2, and a gate receiving a temperature power-up detection signal of the node NA.

The second input unit 830 includes a sixth PMOS transistor MP23 and an eighth NMOS transistor MN25. The sixth PMOS transistor MP23 has a source coupled to the terminal of the external power supply voltage VEXT, a drain coupled to an output node N6, and a gate coupled to the terminal of the ground voltage VSS. The eighth NMOS transistor MN25 has a source coupled to the terminal of the ground voltage VSS and drain and gate coupled to the output node N6.

The comparison unit 810 includes a pseudo differential amplifier receiving the output signals of the first input unit 820 and the second input unit 830. The comparison unit 810 includes a twelfth NMOS transistor MN23, a tenth NMOS transistor MN21, an eleventh NMOS transistor MN22, a seventh PMOS transistor MP21, and an eighth PMOS transistor MP22. The twelfth NMOS transistor MN23 has a source coupled to the terminal of the ground voltage VSS, a drain coupled to a node N5, and a gate receiving the temperature power-up detection signal of the node NA. The tenth NMOS transistor MN21 has a source coupled to the node N5, a drain coupled to a node N7, and a gate coupled to the node N4. The eleventh NMOS transistor MN22 has a source coupled to the node N5, a drain coupled to a node N8, and a gate coupled to the output node N6. The seventh PMOS transistor MP21 has a source coupled to the terminal of the external power supply voltage VEXT, and a drain and a gate coupled to the node 7. The eighth PMOS transistor MP22 has a source coupled to the terminal of the external power supply voltage VEXT, a drain coupled to the node 8, and a gate coupled to the node 7.

The switching unit 840 includes a third inverter INV3, a transmission gate TG, a ninth NMOS transistor MN26, a NOR gate NOR1, a fourth inverter INV4. The third inverter INV3 has an input node coupled to the power-up detection node NC. The transmission gate TG selectively transfers the output signal NE of the comparison unit 810 in response to an output signal of the third inverter INV3 and the signal of the power-up detection node NC. The ninth NMOS transistor MN26 has a source coupled to the terminal of the ground voltage VSS, a drain coupled to an output node of the transmission gate TG, and a gate coupled to the power-up detection node NC. The NOR gate NOR1 receives signals from the transmission gate TG and the power-up detection node NC. The fourth inverter INV4 receives an output of the NOR gate NOR1 and outputs the temperature information T_INFO.

The comparison unit 810 compares the voltage level of the node N4 with the voltage level of the node N6. The voltage level of the node N4 is changed in response to resistance of the first and second resistors R1 and R2. The voltage level of the node N6 is the threshold voltage VTH of the eighth NMOS transistor MN25 at the certain temperature.

When the voltage level of the node N4 is lower than the voltage level of the node N6 in a power-up mode, the logic level of the output signal NE of the comparison unit 810 maintains a logic low level, and when the voltage level of the node N4 is higher than the voltage level of the node N6 by increasing the external power supply voltage VEXT, the logic level of the output signal NE becomes the logic high level. At this time, however, since the power-up detection node NC is charged, the switching unit 840 blocks the output signal NE of the comparison unit 810.

Meanwhile, the switching unit 840 is activated when the power-up detection node NC is discharged, and an operation of the comparison unit 810 depends on a temperature.

Since the voltage level of the node N4 is higher than the voltage level of the node N6 at the room temperature, the output signal NE of the comparison unit 810 is a logic high level, and then the temperature information T_INFO is the logic high level. The sixth NMOS transistor MNT of the temperature compensation unit 550 is turned on, and then the node NA is discharged to a certain voltage level. However, since a size of the sixth NMOS transistor MNT is small compared with the others, e.g., MN1 and MN2, the sixth NMOS transistor MNT does not influence the discharging operation of the power-up detection node NC.

On the contrary, a threshold voltage of the eighth NMOS transistor MN25 becomes higher at a low-temperature compared with the room temperature, and the voltage level of the node N6 is higher than the voltage level of the node N4. The output signal NE of the comparison unit 810 becomes the logic low level, and the temperature information T_INFO is the logic high level. The sixth NMOS transistor MNT of the temperature compensation unit 550 is turned off, and the discharging operation of the sixth NMOS transistor MNT for the node NA is stopped. The voltage level of the node NA is higher as compared with when the discharging operation of the sixth NMOS transistor MNT is performed, and a driving current of the second NMOS transistor MN2 of the discharge driving unit 510 increases. After all, when a system power is reset under the low-temperature environment, a power-up detection node NC which is not completely discharged due to a residue supply voltage may be compensated.

Figure 8A:
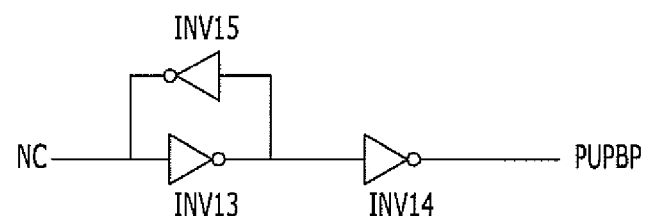
FIGS. 8A and 8B are schematic circuit diagrams illustrating an output unit 540 of the power-up signal generation circuit of FIG. 5.
Figure 8B:
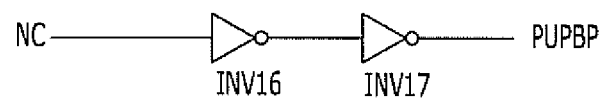

FIGS. 8A and 8B are diagrams illustrating examples of the output unit 540 of the power-up signal generation circuit.

Referring to FIG. 8A, the output unit 540 of the power-up signal generation circuit may include three inverters. The output unit 540 as illustrated in FIG. 8A includes the fifth inverter INV13, the seventh inverter INV15, and the sixth inverter INV14. The fifth inverter INV13 has an input node coupled to the power-up detection node NC. The seventh inverter INV15 receives an output signal of the fifth inverter INV13 and outputs an output signal to the power-up detection node NC. The sixth inverter INV14 receives an output signal of the fifth inverter INV13 and outputs the power-up signal PUPBP.

Meanwhile, according to an example, as illustrated in FIG. 8B, only two inverters, i.e., an eighth INV16 and a ninth INV17, may replace the latch circuit of fifth and seventh inverters INV13 and INV15 to be used to implement the output unit 540.

In accordance with the embodiments of the present invention, a malfunction of the semiconductor integrated circuit may be prevented from being caused by a power-up signal generation error. Therefore, the reliability of the semiconductor IC may increase. In particular, the power-up signal is generated by accurately detecting a voltage level of the internal power supply voltage in a low-temperature environment.

While the present invention has been described with respect to the specific embodiments, it will be apparent to those skilled in the art that various changes and modifications may be made without departing from the spirit and scope of the invention as defined in the following claims.

For example, the configuration of the above-described temperature detection unit may be modified in various manners, and the activation method of the temperature information T_INFO may be changed depending on the configuration of the temperature detection unit.

Furthermore, the types and numbers of logic circuits and MOS transistors used in the above-described embodiments may be changed depending on the active polarities of input/output signals.

What is claimed is:

1. A power-up signal generation circuit of a semiconductor integrated circuit, comprising:
    a discharge driving unit configured to discharge a voltage of a power-up detection node in response to an external power supply voltage;
    a charge driving unit configured to charge the voltage of the power-up detection node in response to an internal power supply voltage;
    a power reset discharging unit configured to discharge the voltage of the power-up detection node while the semiconductor integrated circuit is reset; and
    an output unit configured to output a power-up signal in response to a voltage change of the power-up detection node.

2. The power-up signal generation circuit of claim 1, further comprising:
    a temperature compensation unit configured to control a discharge driving current of the discharge driving unit in response to a temperature information.

3. The power-up signal generation circuit of claim 2, wherein the temperature compensation unit comprises a sixth NMOS transistor having a source coupled to a terminal of a ground voltage, a drain coupled to the control node, and a gate receiving the temperature information.

4. The power-up signal generation circuit of claim 2, further comprising a temperature detection unit configured to generate the temperature information.

5. The power-up signal generation circuit of claim 4, wherein the temperature detection unit comprises:
    a first input unit configured to divide the external power supply voltage and output the divided voltage;
    a second input unit configured to output a threshold voltage for a corresponding temperature;
    a comparison unit configured to compare an output signal of the first input unit with the threshold voltage of the second input unit; and
    a switching unit configured to selectively output an output signal of the comparison unit as the temperature information in response to a voltage level of the power-up detection node.

6. The power-up signal generation circuit of claim 5, wherein the first input unit comprises:
    a first resistor coupled between a terminal of the external power supply voltage and a first output node;
    a second resistor having one end coupled to the first output node; and
    a seventh NMOS transistor having a source coupled to a terminal of the ground voltage, a drain coupled to the other end of the second resistor, and a gate receiving a temperature detection enable signal.

7. The power-up signal generation circuit of claim 6, wherein the second input unit comprises:
    a fifth PMOS transistor having a source coupled to the terminal of the external power supply voltage, a drain coupled to a second output node, and a gate coupled to the terminal of the ground voltage; and
    an eighth NMOS transistor having a source coupled to the terminal of the ground voltage, and a drain and a gate coupled to the second output node.

8. The power-up signal generation circuit of claim 5, wherein the comparison unit comprises a pseudo differential amplifier configured to receive the output signals of the first input unit and the second input unit.

9. The power-up signal generation circuit of claim 5, wherein the switching unit comprises:
    a first inverter having an input node coupled to the power-up detection node;
    a transmission gate configured to selectively transfer the output signal of the comparison unit in response to an output signal of the first inverter and a signal of the power-up detection node;
    a ninth NMOS transistor having a source coupled to a terminal of the ground voltage, a drain coupled to an output node of the transmission gate, and a gate coupled to the power-up detection node;
    a NOR gate configured to receive signals from the transmission gate and the power-up detection node; and
    a second inverter configured to receive an output signal of the NOR gate and output the temperature information.

10. The power-up signal generation circuit of claim 1, wherein the discharge driving unit comprises:

a first PMOS transistor having a source coupled to a terminal of the external power supply voltage, a drain coupled to a control node, and a gate coupled to a terminal of a ground voltage;

a first NMOS transistor having a source coupled to the terminal of the ground voltage and a drain and a gate coupled to the control node; and a second NMOS transistor having a source coupled to the terminal of the ground voltage, a drain coupled to the power-up detection node, and a gate coupled to the control node.

11. The power-up signal generation circuit of claim 1, wherein the charge driving unit comprises:

a second PMOS transistor having a source coupled to a terminal of the internal power supply voltage and a drain and a gate coupled to a first node; and a third PMOS transistor having a source coupled to the first node, a drain coupled to the power-up detection node, and a gate coupled to a terminal of a ground voltage.

12. The power-up signal generation circuit of claim 1, wherein the power reset discharging unit comprises:

a third NMOS transistor having a drain coupled to the power-up detection node and a gate coupled to a terminal of the external power supply voltage;

a fourth PMOS transistor having a source coupled to a source of the third NMOS transistor and a gate coupled to the terminal of the external power supply voltage;

a fourth NMOS transistor having a source coupled to a terminal of a ground voltage, a drain coupled to a drain of the fourth PMOS transistor, and a gate coupled to the terminal of the external power supply voltage;

a fifth NMOS transistor having a source coupled to the terminal of the ground voltage, a drain coupled to the power-up detection node, and a gate coupled to the drain of the fourth NMOS transistor; and a capacitor coupled between the source of the third NMOS transistor and the terminal of the ground voltage.

13. The power-up signal generation circuit of claim 1, wherein the output unit comprises:

a third inverter having an input node coupled to the power-up detection node;

a sixth PMOS transistor having a source coupled to a terminal of the internal power supply voltage, a drain coupled to the power-up detection node, and a gate coupled to an output node of the third inverter; and a fourth inverter configured to receive an output signal of the third inverter and output the power-up signal.

14. The power-up signal generation circuit of claim 1, wherein the output unit comprises:

a fifth inverter having an input node coupled to the power-up detection node;

a sixth inverter configured to receive an output signal of the fifth inverter and output the power-up signal; and a seventh inverter having an input node coupled to an output node of the fifth inverter and an output node coupled to the power-up detection node.

15. The power-up signal generation circuit of claim 1, wherein the output unit comprises:

a eighth inverter having an input node coupled to the power-up detection node; and a ninth inverter configured to receive an output signal of the eighth inverter and output the power-up signal.

16. A power-up signal generation circuit of a semiconductor integrated circuit, comprising:

a discharge driving unit configured to discharge a voltage of a power-up detection node in response to an external power supply voltage;

a charge driving unit configured to charge the voltage of the power-up detection node in response to an internal power supply voltage;

an output unit configured to output a power-up signal in response to a voltage change of the power-up detection node; and a temperature compensation unit configured to raise a discharge driving voltage of the discharge driving unit in response to a temperature information while the semiconductor integrated circuit is reset, wherein the temperature compensation unit comprises a third NMOS transistor having a source coupled to a terminal of a around voltage, a drain coupled to the control node, and a gate receiving the temperature information.

17. The power-up signal generation circuit of claim 16, wherein the discharge driving unit comprises:

a first PMOS transistor having a source coupled to a terminal of the external power supply voltage, a drain coupled to a control node, and a gate coupled to a terminal of a ground voltage;

a first NMOS transistor having a source coupled to the terminal of the ground voltage, a drain and a gate coupled to the control node; and a second NMOS transistor having a source coupled to the terminal of the ground voltage, a drain coupled to the power-up detection node, and a gate coupled to the control node.

18. The power-up signal generation circuit of claim 16, further comprising a temperature detection unit configured to generate the temperature information.

19. The power-up signal generation circuit of claim 18, wherein the temperature detection unit comprises;

a first input unit configured to divide the external power supply voltage and output the divided voltage;

a second input unit configured to output a threshold voltage for a corresponding temperature;

a comparison unit configured to compare an output signal of the first input unit with the threshold voltage of the second input unit; and a switching unit configured to selectively output an output signal of the comparison unit as the temperature information in response to a level of the power-up detection node.

20. A power-up signal generation circuit of a semiconductor integrated circuit, comprising:

a power supply voltage detection unit configured to detect an external power supply voltage and an internal power supply voltage and generate a power-up signal, wherein the power supply voltage detection unit is configured to generate the power-up signal with a driving voltage charged and discharged in response to the internal and external power supply voltages, respectively;

a temperature compensation unit configured to control the driving voltage in response to a temperature information; and a power reset discharging unit configured to discharge the driving voltage in response to the external power supply voltage.

* * * * *